US010872916B2

(12) United States Patent
Suzuki

(10) Patent No.: US 10,872,916 B2
(45) Date of Patent: Dec. 22, 2020

(54) OPTICAL ELEMENT, IMAGE SENSOR PACKAGE, IMAGING DEVICE AND ELECTRONIC DEVICE

(71) Applicant: Sony Corporation, Tokyo (JP)

(72) Inventor: Yusuke Suzuki, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/470,080

(22) PCT Filed: Nov. 15, 2017

(86) PCT No.: PCT/JP2017/041114
§ 371 (c)(1),
(2) Date: Jun. 14, 2019

(87) PCT Pub. No.: WO2018/110190
PCT Pub. Date: Jun. 21, 2018

(65) Prior Publication Data
US 2019/0319053 A1    Oct. 17, 2019

(30) Foreign Application Priority Data

Dec. 16, 2016 (JP) ................. 2016-244747

(51) Int. Cl.
*H01L 27/146* (2006.01)
*G02B 1/118* (2015.01)

(52) U.S. Cl.
CPC .......... *H01L 27/1462* (2013.01); *G02B 1/118* (2013.01); *H01L 27/14618* (2013.01); *H01L 27/14627* (2013.01)

(58) Field of Classification Search
CPC .......... H01L 27/1462; H01L 27/14625; H01L 27/14618; G02B 1/118; G02B 5/208; G02B 3/0006; H04N 5/369
See application file for complete search history.

(56) References Cited

U.S. PATENT DOCUMENTS

2014/0205805 A1* 7/2014 Takihara ................. G02B 1/14
428/142
2018/0373082 A1* 12/2018 Kitamura ................. E06B 3/66
2019/0155111 A1* 5/2019 Tanaka ............. G02F 1/134309

FOREIGN PATENT DOCUMENTS

| CN | 101859075 A | 10/2010 |
| CN | 103048705 A | 4/2013 |
| CN | 104516032 A | 4/2015 |
| JP | 2005-062674 A | 3/2005 |

(Continued)

OTHER PUBLICATIONS

International Search Report and Written Opinion issued in connection with International Patent Application No. PCT/JP2017/041114, dated Jan. 9, 2018. (15 pages).

*Primary Examiner* — Dung A. Le
(74) *Attorney, Agent, or Firm* — K&L Gates LLP

(57) ABSTRACT

An optical element includes: a base; and an uneven structure layer that is disposed on at least one face of the base, and suppresses reflectance, the optical element having a reflectance of 1% or smaller, in a wavelength region of 400 nm or longer and 700 nm or shorter, a transmittance of 90% or larger, in a wavelength region of 470 nm or longer and 550 nm or shorter, and a variation of transmittance of 1% or smaller, between before and after a high-temperature environmental test conducted at 150° C. for 250 h.

29 Claims, 12 Drawing Sheets

(56) References Cited

FOREIGN PATENT DOCUMENTS

| | | |
|---|---|---|
| JP | 2009-015076 A | 1/2009 |
| JP | 2010-256546 A | 11/2010 |
| JP | 2012-227190 A | 11/2012 |
| JP | 2013-083871 A | 5/2013 |
| JP | 2015-068853 A | 4/2015 |
| JP | 2016-126066 A | 7/2016 |
| WO | 2013/005769 A1 | 1/2013 |
| WO | 2016/159290 A1 | 10/2016 |

* cited by examiner

A

B

A

B

OPTICAL ELEMENT, IMAGE SENSOR PACKAGE, IMAGING DEVICE AND ELECTRONIC DEVICE

CROSS-REFERENCE TO RELATED APPLICATIONS

The present application claims the benefit of International Application No. PCT/JP2017/041114, filed Nov. 15, 2017, which claims priority to Japanese Application No. 2016-244747, filed Dec. 16, 2016, the disclosures of which are incorporated herein by reference.

BACKGROUND

This technology relates to an optical element, an image sensor package, an imaging device, and an electronic device.

There is a known method of forming an uneven structure as fine as, or smaller than wavelength of light, on the surface of an optical element, so as to functionalize the optical element to be anti-reflective. Such fine uneven structure is typically called a moth-eye structure.

In recent years, the moth-eye structure has been examined for applications in a variety of optical elements. For example, studies have been made on application of the moth-eye structure to a cover glass of an image sensor package. Note that, in this specification, an image sensor housed in a package will be referred to as an image sensor package.

SUMMARY

Technical Problem

The moth-eye structure, when used for the cover glass, is however anticipated to cause a problem below. That is, an image sensor package, when kept in a hot environment, may degrade quality of images captured in the image sensor package.

It is therefore an object of this technology to provide an optical element capable of suppressing images captured in the image sensor package from degrading when the image sensor package is kept in a hot environment, and, an image sensor package, an imaging device, and an electronic device having the same.

Solution to Problem

A first technology to achieve the above object relates to an optical element including: a base; and an uneven structure layer that is disposed on at least one face of the base, and suppresses reflectance, the optical element having a reflectance of 1% or smaller, in a wavelength region of 400 nm or longer and 700 nm or shorter, a transmittance of 90% or larger, in a wavelength region of 470 nm or longer and 550 nm or shorter, and a variation of transmittance of 1% or smaller, between before and after a high-temperature environmental test conducted at 150° C. for 250 h.

A second technology relates to an image sensor package that includes the optical element of the first technology.

A third technology relates to an imaging device including the image sensor package of the second technology.

A fourth technology relates to an electronic device including the image sensor package of the second technology.

Advantageous Effects of Invention

According to this technology, the image sensor package will now be able to suppress quality of images from being degraded, even if the image sensor package is kept in a hot environment.

DETAILED DESCRIPTION

Embodiment of this technology will be explained according to the order below.
1 First Embodiment (example of image sensor package)
2 Second Embodiment (example image sensor package)
3 Third Embodiment (example camera module)

4 Fourth Embodiment (example of image sensor package applied to imaging device)
5 Fifth Embodiment (example of image sensor package applied to imaging device)
6 Sixth Embodiment (examples of camera module applied to various electronic devices)

1 First Embodiment

[Structure of Image Sensor Package]

Figure 1:
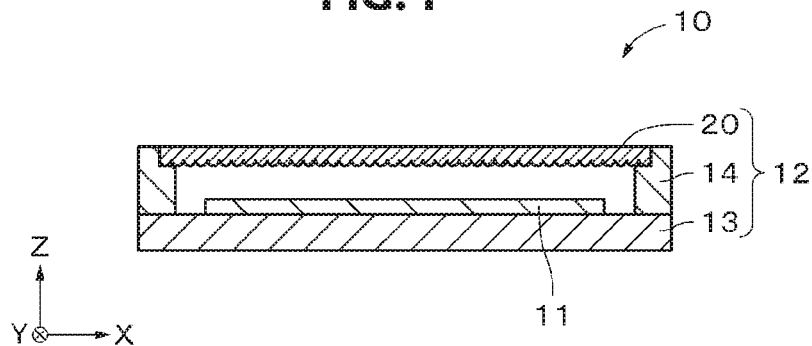
FIG. 1A is a cross-sectional view illustrating an exemplary structure of an image sensor package according to the first embodiment of this technology.
FIG. 1B is a partially enlarged cross-sectional view of FIG. 1A.
FIG. 1C is a plan view illustrating an exemplary structure of an optical element.
Figure 1:
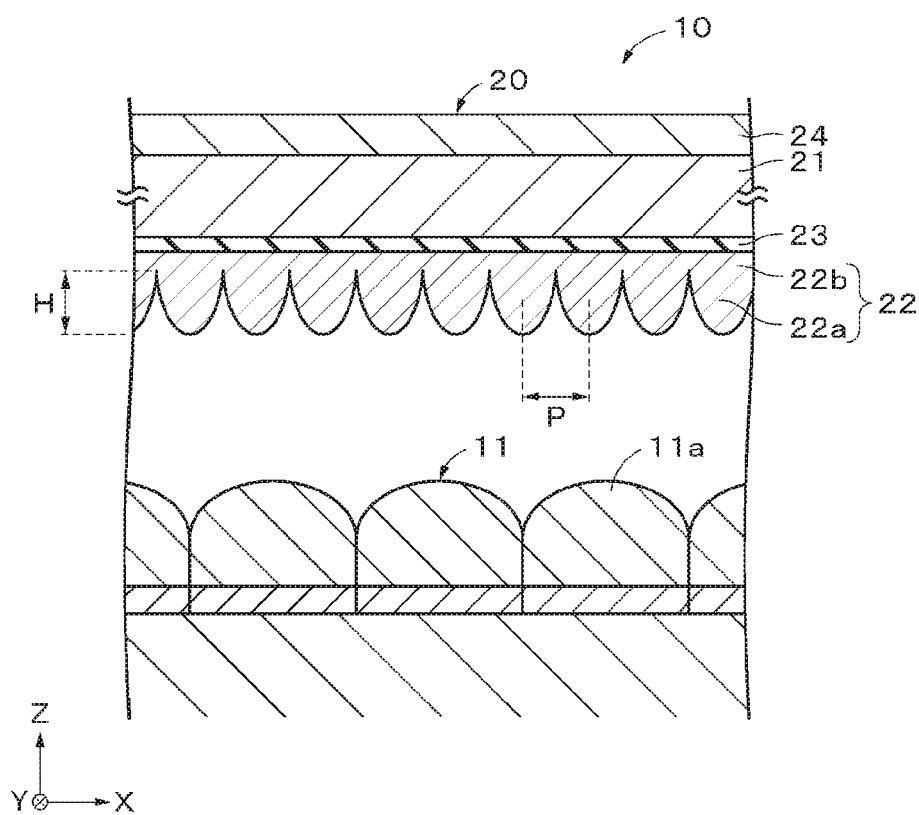
Figure 1:
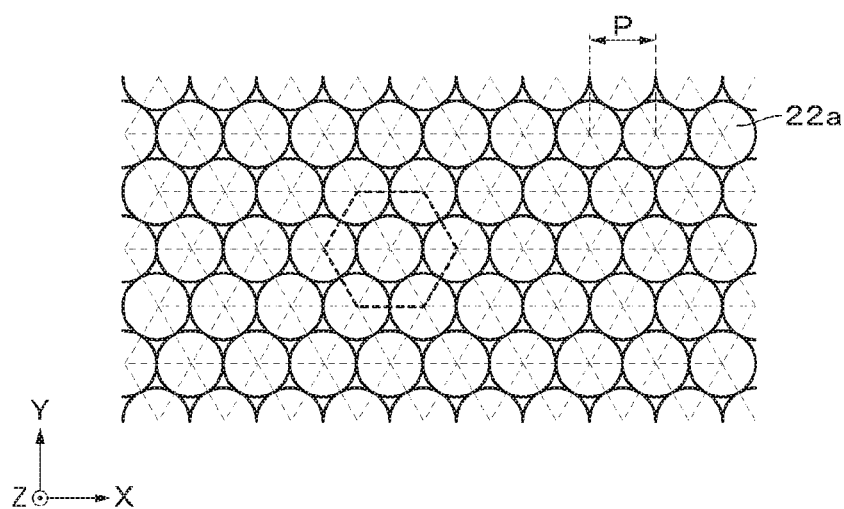

An image sensor package according to a first embodiment of this technology (referred to as "element package", hereinafter) 10 has, as illustrated in FIG. 1A, an image sensor 11, and a package 12 that houses the image sensor 11.

(Image Sensor)

The image sensor 11 is typically a CCD (Charge Coupled Device) image sensor element, a COMS (Complementary Metal Oxide Semiconductor) image sensor element, or the like. The image sensor 11 has, as illustrated in FIG. 1B, a plurality of microlenses 11a on a face of element (imaging surface) on which light from an object is incident. The plurality of microlenses 11a are arranged on the imaging surface according to a predetermined pattern.

(Package)

The package 12 has a substrate 13, a frame 14 disposed on the circumference of one face of the substrate 13, and an optical element 20 supported at the circumference by the frame 14. The image sensor 11 is disposed on one face of the substrate 13. The optical element 20 is supported by the frame 14 so as to be opposed to the imaging surface of the image sensor 11, and away from the imaging surface.

(Optical Element)

The optical element 20 forms a cover intended for the image sensor package, and has, as illustrated in FIG. 1B, a plate-like base 21 for the image sensor package, an uneven structure layer (simply referred to as "structural layer", hereinafter) 22 that is disposed on one face of the base 21, and has a function for suppressing reflectance, a silane coupling agent 23 applied between the base 21 and the structural layer 22, and a multilayered film 24 that is disposed on the other face of the base 21, and has a function for suppressing reflectance. The optical element 20 is supported by the frame 14, so that the structural layer 22 is opposed to the image sensor 11, that is, so that the structural layer 22 is faced towards the inside of the element package 10.

Now, "the function for suppressing reflectance" regarding the structural layer 22 means a function for suppressing reflectance of light incident on one face of the base 21, by which at least reflection of visible light may be suppressed. Meanwhile, "the function for suppressing reflectance" regarding the multilayered film 24 means a function for suppressing reflectance of light incident on the other face of the base 21, by which at least reflection of visible light may be suppressed.

Note that the silane coupling agent 23 is optional, and is omissible. However, from the viewpoint of suppressing adhesiveness of the structural layer 22 to the base 21 from degrading, it is preferable to provide the silane coupling agent 23. Also note that the multilayered film 24 is optional, and is omissible. However, from the viewpoint of suppressing reflection of light on the other face of the base 21, it is preferable to provide the multilayered film 24. The optical element 20 may further have a silane coupling agent (not illustrated) applied between the base 21 and the multilayered film 24. It is now defined that two orthogonal directions that lie in the plane of the face of base 21 will be denoted respectively as X-axis direction (first direction) and Y-axis direction (second direction), and the direction perpendicular to the face (XY plane) will be denoted as Z-axis direction (third direction).

Next, the base 21, the structural layer 22, the silane coupling agent 23 and the multilayered film 24, which are provided to the optical element 20, will be explained in sequence below.

(Base)

The base 21 is composed using an inorganic material transparent at least to visible light. In this specification, the visible light means light in the wavelength region typically exceeding 350 nm, and 850 nm or shorter. The organic material is typically at least one of glass, crystallized glass, or crystal. The glass is at least one of aluminosilicate glass, soda-lime glass, soda-alumino silicate glass, aluminoborosilicate glass, borosilicate glass, or quartz glass. The crystallized glass typically contains, as its main crystal phase, at least one of spinel-based crystals ($RAl_2O_4$: R represents one or more elements selected from Zn, Mg and Fe), $R_2TiO_4$, lithium bisilicate, enstatite ($MgSiO_3$), β-quartz, α-cristobalite, or solid solutions of these compounds. The crystal is a single crystal or polycrystal containing typically at least one of sapphire, rock crystal, silicon, silicon carbide, or gallium nitride.

(Structural Layer)

The structural layer 22, which is a reflection suppressing layer, is a so-called moth-eye structural layer, and has a function for suppressing reflection of at least visible light. The structural layer 22 has a plurality of structures 22a arranged on one face of the base 21, and an intermediate layer (optical layer) 22b disposed between the lower parts of the plurality of structures 22a and the face of the base 21.

Each structure 22a has a so-called submicron structure. The structure 22a has a protruded form that rises up from the face of the base 21. The plurality of structures 22a are arranged, as illustrated in FIG. 1C, at an array pitch P not longer than the wavelength in the visible region, whose reflection is desired to be suppressed (for example, 350 nm or shorter). Height H of the structure 22a is set typically, but not limited to, within the range from 236 nm or longer and 450 nm or shorter.

The structure 22a preferably has an aspect ratio of 1 or larger, since excellent function for suppressing reflection and transmission characteristic will be obtained, if the aspect ratio is set to 1 or larger. The upper limit of the aspect ratio of the structure 22a is preferably 2 or smaller, and more preferably 1.46 or smaller, since with the aspect ratio set to 2 or smaller, a master plate may easily be released from the structural layer 22 in the process of molding the structural layer 22. Now the aspect ratio of the structure 22a means a ratio of the height H of the structure 22a, relative to the array pitch P of the structure 22a (H/P).

The array pitch P, height H and aspect ratio (H/P) of the structure 22a are determined as described below. First, the optical element 20 is cut so as to intersect the apex of the structure 22a, and the cross section is photographed under a transmission electron microscope (TEM). Next, on the thus obtained TEM image, the height H and the array pitch P of the structure 22a are determined. Using the thus determined height H and the array pitch P, the aspect ratio (H/P) is determined.

The plurality of structure 22a are typically arranged so as to form, for example, a plurality of rows over the face of the base 21. Each row has a straight form or a curved form. The base 21 may alternatively have, on its face, the straight row and the curved row in a mixed manner. The curve is exemplified by periodically or non-periodically meandering curve. Specific examples of such curve include waveforms of sine wave and triangle wave, but not limited thereto.

Mode of arrangement of the plurality of structures 22a over the face of the base 21 may be either regular arrangement or irregular arrangement. The regular arrangement is preferably an arrangement in the form of lattice such as tetragonal lattice, quasi-tetragonal lattice, hexagonal lattice, and quasi-hexagonal lattice. Note that FIG. 1C illustrates an exemplary arrangement of the plurality of structures 22a in the form of hexagonal lattice. Now the tetragonal lattice means a square lattice. The quasi-tetragonal lattice means a distorted tetragonal lattice. The hexagonal lattice means a regular hexagonal lattice. The quasi-hexagonal lattice means a distorted hexagonal lattice.

Specific examples of shapes of the structure 22a include pyramid, column, needle, semisphere, semi-ellipsoid and polygon. The shapes are, however, not limited thereto, allowing any other shapes to be used. The pyramid is exemplified by, but not limited to, pyramid with sharp apex, pyramid with flat apex (so-called truncated pyramid), and pyramid having apex with convex or concave curved face. The pyramid having apex with convex curved face is exemplified by quadric surface such as paraboloid. Alternatively, the pyramidal surface of pyramid may be curved in a protruded or concave manner.

The plurality of structures 22a arranged over the face of the base 21 may have entirely the same size, shape and height, or may contain those with different sizes, shapes and heights. Alternatively, the plurality of structures 22a may contain those connected so as to overlap the lower parts together.

The intermediate layer 22b is a layer formed on the lower side of the structures 22a, so as to be integrated with the structures 22a, using the same material with the structures 22a. Note that the intermediate layer 22b is optional, and is omissible.

The intermediate layer 22b preferably has a thickness of 10 nm or thicker and 50 μm or thinner, which is more preferably 30 nm or thicker and 25 μm or thinner, and even more preferably 50 nm or thicker and 10 μm or thinner. With the thickness thicker than 50 μm, the intermediate layer 22b may cause cure shrinkage when formed by curing an energy ray curable resin composition, and may result in adhesion failure between the intermediate layer 22b and the base 21. Also lowered transmittance is anticipated. Meanwhile, with the thickness below 10 nm, the intermediate layer 22b will not be able to relieve stress applied to the structures 22a downwardly through the structures 22a, causing breakage of the structures 22a, and thereby degrading the mechanical characteristics of the optical element 20.

The structural layer 22 contains an organic material. The organic material is a cured article (polymer) of an energy ray curable resin composition. For the energy ray curable resin composition, preferably used is UV curable resin composition. It is more preferable for the structural layer 22 to additionally contain an infrared absorber. This is because structural layer 22 which is given UV absorbability will be able to reduce energy of infrared radiation that reaches the image sensor 11. The structural layer 22 may optionally contain at least one of filler, functional additive other than the infrared absorber, or resin other than the energy ray curable resin composition.

The UV curable resin composition may be of solvent type or may be of solventless-type. The solventless type is preferable, since the solventless-type UV curable resin composition need no drying process for vaporizing a solvent, and also for its advantages of low odor and weak impact to human body attributable to absence of solvent vaporization.

The UV curable resin composition contains a polymerizable compound and an initiator. "Polymerizable" means at least either radical-polymerizable or cation-polymerizable. The polymerizable compound is preferably at least one of a first composition that contains a first compound having (meth)acryloyl group and a second compound having vinyl group; or a second composition that contains a compound having (meth)acryloyl group and vinyl group. With polymers of these polymerizable compounds contained in the structural layer 22, such structural layer 22 may be prevented from being denatured during reflow process, and also from being denatured in high-temperature and low-temperature environments. Hence images captured in the element package 10 may be prevented from being degraded during the reflow process, or in the high-temperature and low-temperature environments. Also excellent translucency is obtainable.

Now the (meth)acryloyl group means acryloyl group or methacryloyl group. As the first compound having (meth)acryloyl group, employable is monomer having one or two or more (meth)acryl groups, or oligomer having one or two or more (meth)acryl groups, each of which may be used independently, or both of which may be used in a combined manner. As the second compound having vinyl group, employable is a monomer having one or two or more vinyl groups, or oligomer having one or two or more vinyl groups, each of which may be used independently, or both of which may be used in a combined manner. As the compound having (meth)acryloyl group and vinyl group, employable is a monomer having one or two or more (meth)acryloyl groups and one or two or more vinyl groups, or oligomer having one or two or more (meth)acryloyl groups and one or two or more vinyl groups, each of which may be used independently, or both of which may be used in a combined manner.

As the compound having (meth)acryloyl group, employable for example is at least one of monofunctional monomer, bifunctional monomer or polyfunctional monomer.

The monofunctional monomer is exemplified by carboxylic acids (acrylic acid), hydroxy compounds (2-hydroxyethyl acrylate, 2-hydroxypropyl acrylate, 4-hydroxybutyl acrylate); alkyl compounds; alicyclic compounds (isobutyl acrylate, t-butyl acrylate, isooctyl acrylate, lauryl acrylate, stearyl acrylate, isobornyl acrylate, cyclohexyl acrylate); and other functional monomers (2-methoxyethyl acrylate, methoxyethylene glycol acrylate, 2-ethoxyethyl acrylate, tetrahydrofurfuryl acrylate, benzyl acrylate, ethylcarbitol acrylate, phenoxyethyl acrylate, N,N-dimethylamino ethyl acrylate, N,N-dimethylaminopropylacrylamide, N,N-dimethylacrylamide, acryloylmorpholine, N-isopropylacrylamide, N,N-diethylacrylamide, 2-(perfluorooctyl)ethyl acrylate, 3-perfluorohexyl-2-hydroxypropyl acrylate, 3-perfluorooctyl-2-hydroxypropyl acrylate, 2-(perfluorodecyl)ethyl acrylate, 2-(perfluoro-3-methylbutyl)ethyl acrylate, 2,4,6-tribromophenol acrylate, 2,4,6-tribromophenol methacrylate, 2-(2,4,6-tribromophenoxy)ethyl acrylate, and 2-ethylhexyl acrylate).

The bifunctional monomer is exemplified by, but not limited to, tri(propyleneglycol) diacrylate, trimethylolpropane diallyl ether, and urethane acrylate.

The polyfunctional monomer is exemplified by, but not limited to, trimethylolpropane triacrylate, dipentaerythritol penta- or hexa-acrylate, and ditrimethylolpropane tetraacrylate.

The compound having vinyl group is exemplified by, but not limited to, N-vinylpyrrolidone, ethylene glycol divinyl ether, pentaetythritol divinyl ether, 1,6-hexanediol divinyl ether, trimethylolpropane divinyl ether, ethylene oxide-modified hydroquinone divinyl ether, ethylene oxide-modified bisphenol A divinyl ether, pentaetythritol trivinyl ether, dipentaerythritol hexavinyl ether, and ditrimethylolpropane polyvinyl ether.

As the compound having (meth)acryloyl group and vinyl group, employable is at least one of the aforementioned compound having (meth)acryloyl group and additionally introduced vinyl group, or the aforementioned compound having vinyl group and additionally introduced (meth)acryloyl group, but not limited thereto.

The initiator is exemplified by, but not limited to, 2,2-dimethoxy-1,2-diphenylethane-1-one, 1-hydroxy-cyclohexylphenylketone, and 2-hydroxy-2-methyl-1-phenylpropane-1-one.

As the filler, both of inorganic particle and organic particle are employable, for example. The inorganic particle is exemplified by particle of metal oxides such as $SiO_2$, $TiO_2$, $ZrO_2$, $SnO_2$, and $Al_2O_3$. Functional additives other than the infrared absorber are exemplified by tone correction dye, antistatic agent, heat stabilizer, antioxidant, dispersion aid, flame retardant, lubricant, plasticizer, leveling agent, surface modifier, and antifoaming agent. The resin other than the energy ray curable resin composition is typically at least one of thermosetting resin or thermoplastic resin.

(Silane Coupling Agent)

Types of the silane coupling agent 23 are not specifically limited, allowing any of known silane coupling agents to be used. Specific examples of the silane coupling agent 23 include vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryl trimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, hydrochloride of N-(vinylbenzyl)-2-aminoethyl-3-aminopropyltrimethoxysilane, 3-ureidopropyltriethoxysilane, 3-chloropropyltrimethoxysilane, 3-mercaptopropylmethyldimethoxysilane, 3-mercaptopropyltrimethoxysilane, bis(triethoxysilylpropyl) tetrasulfide, and 3-isocyanotopropyltriethoxysilane. By using the silane coupling agent 23, adhesiveness of the structural layer 22 to the base 21 will be suppressed from degrading even under a high-temperature and high-humidity environment.

(Reflection Suppressing Layer)

The multilayered film 24 is an exemplary reflection suppressing layer, and has a structure in which two or more films having different refractive indices are stacked. As a material for composing the film, employable is a translucent dielectric material, but not limited thereto.

[Optical Characteristics of Optical Element]

The later described transmittance and reflectance of the optical element 20 are measured by irradiating light onto the optical element 20 from the structural layer 22 side. The measurement methods will be those as described later in EXAMPLES. The variations of transmittance before and after the individual tests are variations of transmittance between before and after the individual test carried out in the wavelength region from 420 nm to 600 nm.

(Reflectance in Wavelength Region of 400 nm or Longer and 700 nm or Shorter)

The optical element 20 preferably has a reflectance of 1% or smaller in the wavelength region of 400 nm or longer and 700 nm or shorter, which is more preferably 0.8 or smaller. With the reflectance exceeding 1%, images obtainable by the element package 10 will be dark, and may degrade.

(Transmittance in Wavelength Region of 470 nm or Longer and 550 nm or Shorter)

The optical element 20 has a transmittance, measured in the wavelength region of 470 nm or longer and 550 nm or shorter, of 90% or larger. With the transmittance smaller than 90%, images obtainable by the element package 10 will be dark, and may degrade. The optical element 20 preferably has a transmittance, measured in the wavelength region of 420 nm or longer and 600 nm or shorter, of 90% or larger. With such transmittance of 90% or larger, good images will be obtainable by the element package 10.

(Variation of Transmittance Between Before and after High-Temperature Environmental Test)

The optical element 20 has a variation of transmittance of 1% or smaller, between before and after a high-temperature environmental test conducted at 150° C. for 250 h, and more preferably has a variation of transmittance of 1% or smaller, between before and after a high-temperature environmental test conducted at 150° C. for 1000 h. With the variation of transmittance of the optical element 20 exceeding 1%, between before and after a high-temperature environmental test conducted at 150° C. for 250 h, the element package 10, when stored in the high temperature environment, may have modified color reproducibility due to denaturation of the structural layer 22, so that images obtainable by the element package 10 may degrade.

(Variation of Transmittance Between Before and after Heat Resistance Test)

The variation of transmittance between before and after the heat resistance test (reflow test) conducted at 245° C. for 5 min is preferably 1% or smaller. With the variation of transmittance exceeding 1%, the element package 10, when mounted on a circuit board or the like in a reflow process, may have modified color reproducibility due to denaturation of the structural layer 22, so that images obtainable by the element package 10 may degrade.

(Variation of Transmittance Between Before and after High-Temperature, High-Humidity Environmental Test)

The optical element 20 preferably has a variation of transmittance of 1% or smaller, between before and after a high-temperature, high-humidity environmental test in which the optical element 20 is kept in an environment of 80° C. and 85% humidity for 250 h. The optical element 20 more preferably has a variation of transmittance of 1% or smaller, between before and after a high-temperature, high-humidity environmental test in which the optical element 20 is kept in an environment of 80° C. and 85% humidity for 1000 h. With the variation of transmittance of exceeding 1%, between before and after the high-temperature, high-humidity environmental test in which the optical element 20 is kept in an environment of 80° C. and 85% humidity for 250 h, the element package 10, when stored in the high-temperature, high-humidity environment, may have modified color reproducibility due to denaturation of the structural layer 22, so that images obtainable by the element package 10 may degrade.

(Variation of Transmittance Between Before and after Low-Temperature Environmental Test)

The optical element 20 preferably has a variation of transmittance of 1% or smaller, between before and after a low-temperature environmental test in which the optical element 20 is kept in an environment of −40° C. for 250 h. The optical element 20 more preferably has a variation of transmittance of 1% or smaller, between before and after a low-temperature environmental test in which the optical element 20 is kept in an environment of −40° C. for 1000 h. With the variation of transmittance of exceeding 1%, between before and after the low-temperature environmental test in which the optical element 20 is kept in an environment of −40° C. for 250 h, the element package 10, when stored in the low-temperature environment, may have modified color reproducibility due to denaturation of the structural layer 22, so that images obtainable by the element package 10 may degrade.

[Adhesiveness of Structural Layer]

Adhesiveness between the base 21 and the structural layer 22 is preferably denoted by any one of classifications 0 to 2, in a cross-cut test in compliance with JIS K5600-5-6. With the adhesiveness fallen out of classifications 0 to 2, the structural layer 22 may be likely to separate partially. If the structural layer 22 partially separates, such partial area will lose brightness, so that images obtainable by the element package 10 may degrade.

[Method for Manufacturing Optical Element]

Next, an exemplary method for manufacturing the optical element 20 according to the first embodiment of this technology will be explained.

(Step of Making Master Plate)

First, a master plate having a mold face formed on a first main surface is manufactured. The mold face has a plurality of structures arranged in a two-dimensional manner. Such plurality of structures formed on the mold face, and the aforementioned plurality of structure 22a provided to the structural layer 22 have a nearly equal shape, but in an inverted complementary relation. Then the mold face may optionally be subjected to release treatment.

Materials for composing the master plate are exemplified by, but not specifically limited to, silicon, glass, and metal. Methods employable for making the master plate include photolithography, combined method of photolithographic process and etching process, anodizing, and a method based on integration of making process of master plate for optical disk and etching process (see JP 2010-156844A, for example). Alternatively, a replica master may be manufactured from a master plate by electroforming, and may be used.

(Step of Surface Treatment)

Next, surface treatment such as corona discharge treatment, UV irradiation treatment or the like, may be applied to one face of the base 21. Next, such one face of the base 21 is treated with the silane coupling agent 23.

(Imprinting Step)

Next, an energy ray curable resin composition, as an imprinting material, is coated on one face of the base 21, the thus coated energy ray curable resin composition is irradiated with an energy ray for curing, and the base 21 integrated with the cured energy ray curable resin composition is released. In this way, obtainable is the optical element 20 having the structural layer 22 formed on one face of the base 21. The optical element 20 may then be cut into a desired size, if necessary.

Employable energy ray includes, but not specifically limited to, electron beam ultraviolet radiation, infrared radiation, laser beam, visible light, ionizing radiation (X-ray, α-ray, β-ray, γ-ray, etc.), microwave, and radio frequency wave.

[Effect]

In the element package 10 according to the first embodiment, the optical element 20 has a variation of transmittance of 1% or smaller, between before and after a high-temperature environmental test conducted at 150° C. for 250 h. Hence the structural layer 22 may be suppressed from being denatured or so, in a case where the element package 10 is kept in a high-temperature environment. As a consequence, images captured in the element package 10, when kept in a high-temperature environment, may be suppressed from being degraded. Moreover, the optical element 20 has a reflectance of 1% or smaller, in a wavelength region of 400 nm or longer and 700 nm or shorter, and has a transmittance of 90% or larger, in a wavelength region of 470 nm or longer and 550 nm or shorter. Hence good images are obtainable by the element package 10.

MODIFIED EXAMPLES

Modified Example 1

Figure 2:
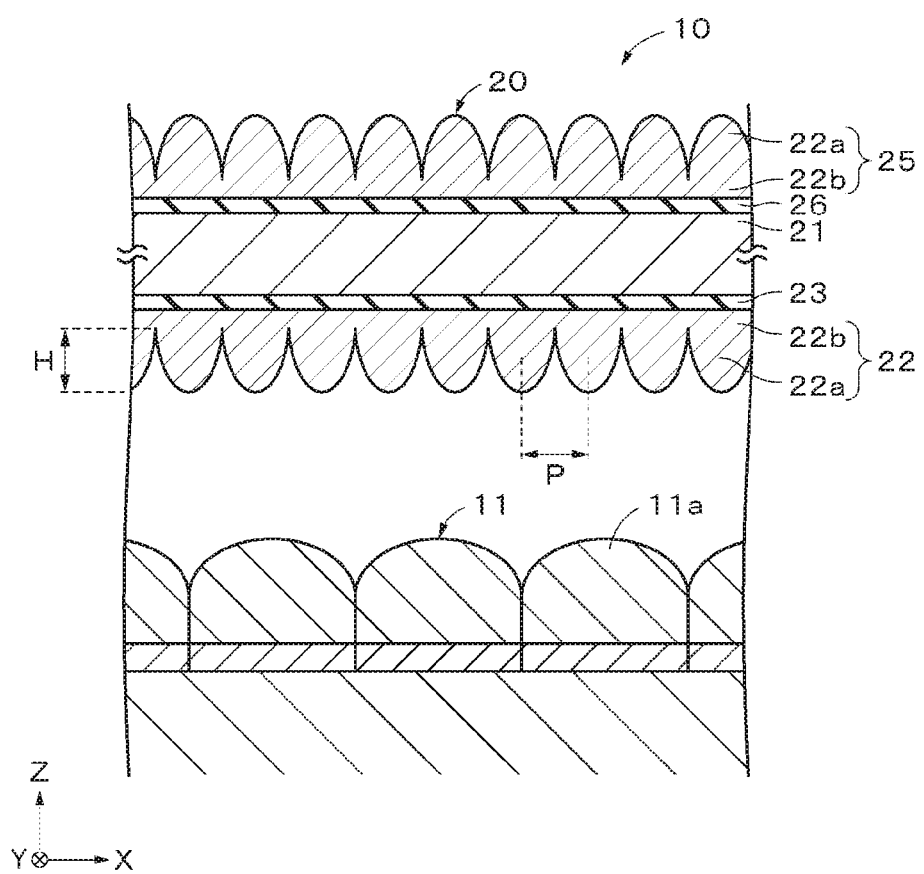
FIG. 2 is a cross-sectional view illustrating an exemplary structure of an image sensor package according to modified example 1 of the first embodiment of this technology.

As illustrated in FIG. 2, the optical element 20 may alternatively have, on the other face of the base 21, a structural layer 25 that functions to suppress reflectance, in place of the multilayered film 24. In this case, a silane coupling agent 26 may be disposed between the other face of the base 21 and the structural layer 25. The structural layer 25 has a structure same as the structural layer 22 in the first embodiment. Note that the array pitch P, height H and aspect ratio (H/P) of the structures 22a in the structural layer 25 and in the structural layer 22 may be same or different.

Modified Example 2

The optical element 20 may be supported by the frame 14 so that the structural layer 22 is faced towards the outside of the element package 10. Note, however, that for the element package 10 which is intended for use in a lens interchange type single-lens reflex camera or the like, the optical element 20 is preferably supported by the frame 14 so that the structural layer 22 is faced towards the inside of the element package 10. The reason is that the structural layer 22, if supported by the frame 14 so as to be faced towards the outside of the element package 10, may easily catch dirt or dust between the structures 22a typically when exchanging lenses, and structural layer 22 may have degraded function for suppressing reflectance.

Modified Example 3

The structure 22a may have a concave shape. However, from the viewpoints of reflection suppressing function and transmission characteristic, the structure 22a preferably has a convex shape as described in the first embodiment.

Modified Example 4

Thermosetting resin may be used as the imprinting material. In this case, the mold face of the master plate and the thermosetting resin are brought into close contact, the thermosetting resin is heated using a heat source such as heater to thereby cure the thermosetting resin, and the base 21 integrated with the thus cured thermosetting resin is separated from the master plate. The optical element 20 is thus obtained.

Modified Example 5

The optical element 20 may alternatively be applied to a light emitting element package. Now the light emitting element package means an article having a light emitting element housed in a package. The light emitting element is exemplified by, but not limited to, semiconductor light emitting elements such as light emitting diode (LED) and laser diode (LD).

Second Embodiment

[Outline]

Figure 3:
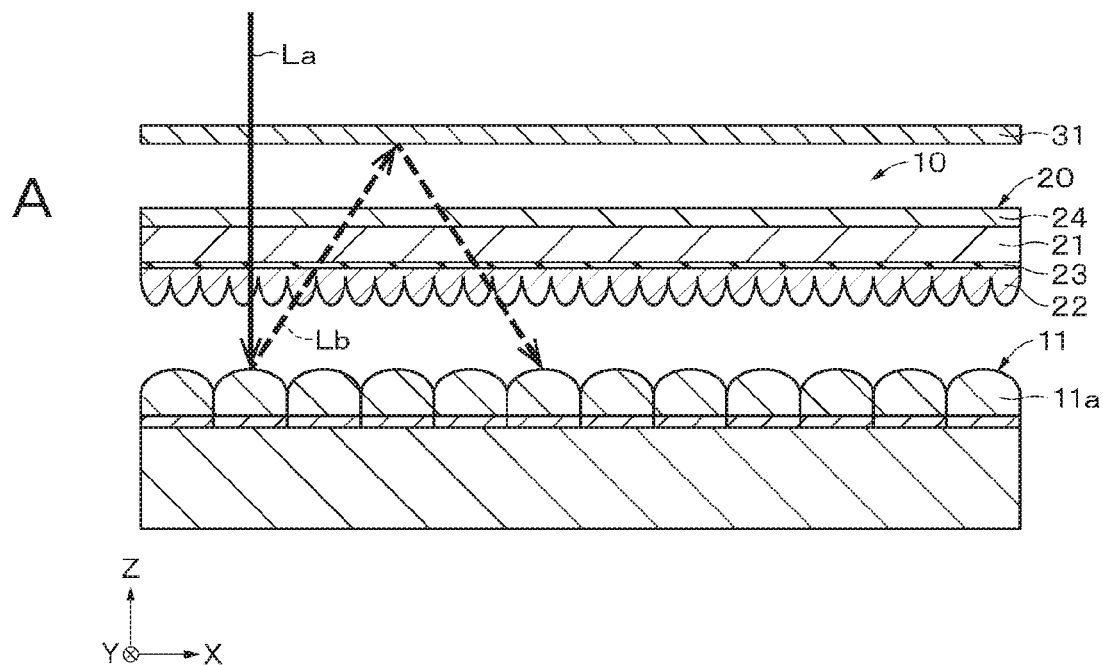
FIG. 3A and FIG. 3B are cross-sectional views individually explaining outlines of image sensor packages according to a second embodiment of this technology.
Figure 3:
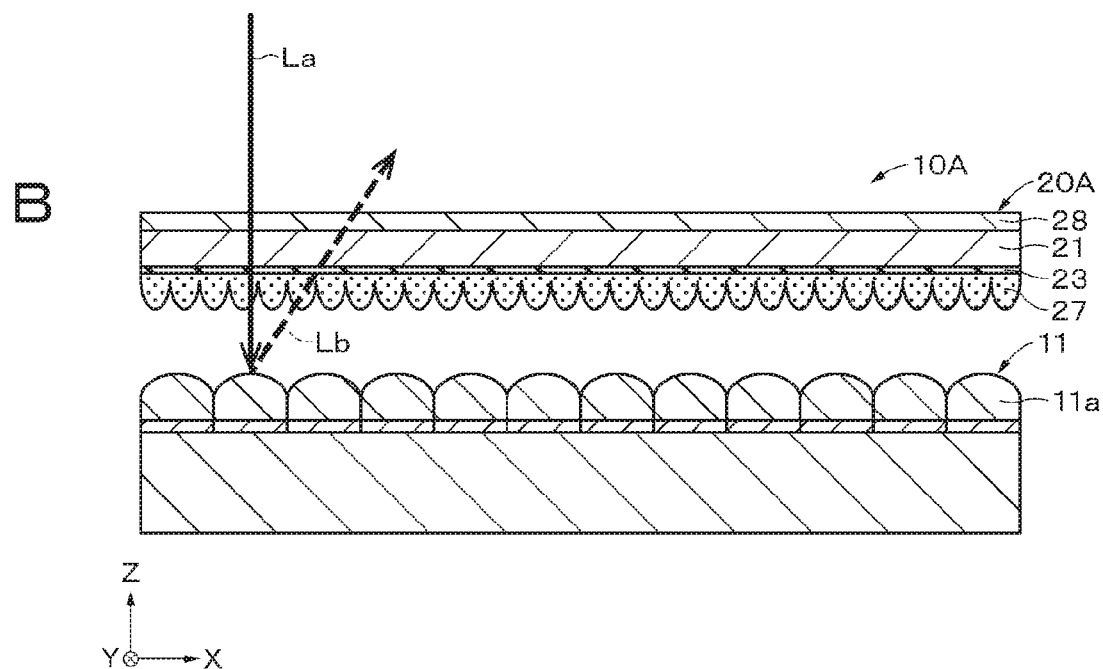

For a case where the element package 10 according to the first embodiment is applied to the imaging device, it is usual as shown in FIG. 3A to arrange a reflective infrared cut filter 31 above the element package 10. However, the thus composed imaging device, when used to shoot a strong light source such as sun light, may produce a red ball pattern (referred to as "ghost orbs", hereinafter) around the light source. The ghost orbs occur as follows. That is, light La in a certain wavelength region incident on the element package 10 is diffracted by the microlenses 11a. Diffracted light Lb is reflected on the infrared cut filter 31, and again comes incident on the image sensor 11. The diffracted light Lb thus came incident again causes the ghost orbs on captured images.

The present inventors therefore conducted thorough examinations into suppression of ghost orbs, and finally reached a structure in which a structural layer 27 that contains a light absorber for absorbing light in a predetermined wavelength region is provided to the optical element 20A as illustrated in FIG. 3B, rather than providing the infrared cut filter 31 to the imaging device, so as to allow the diffracted light Lb to transmit. In the second embodiment, an element package 10A having such structural layer 27 will be explained.

[Structure of Element Package]

Figure 4:
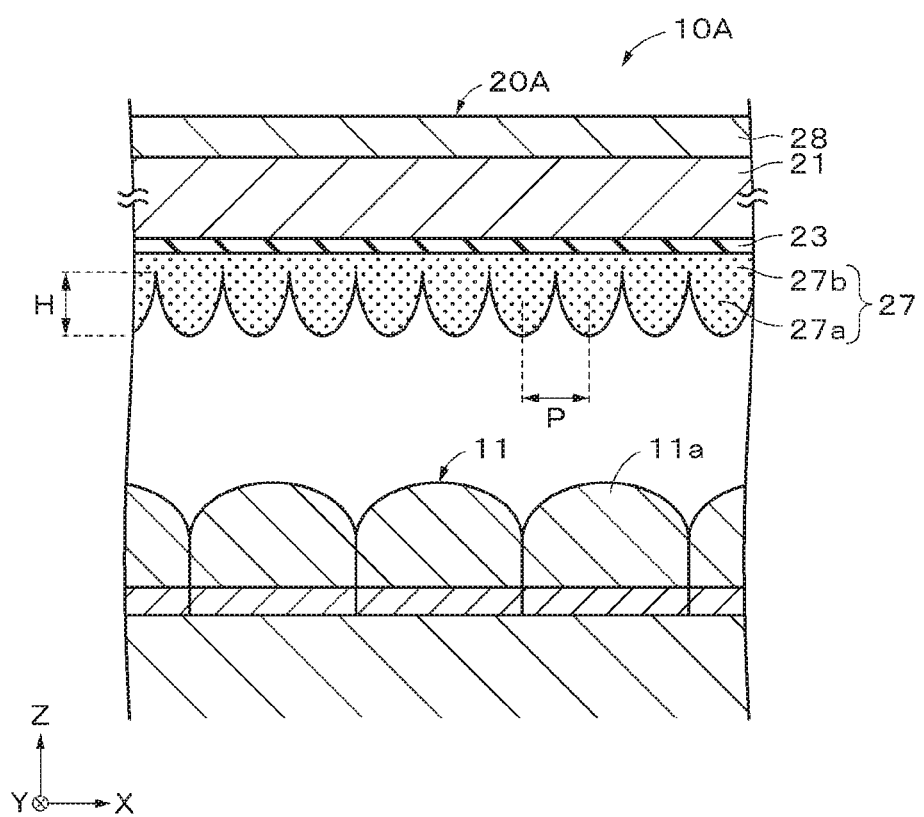
FIG. 4 is a cross-sectional view illustrating an exemplary structure of the image sensor package according to the second embodiment of this technology.

The element package 10A according to the second embodiment of this technology is different from the element package 10 according to the first embodiment, in that the element package 10A has, as illustrated in FIG. 4, the structural layer 27 that contains a light absorber, and a multilayered film 28 that functions to cut light in first and second wavelength regions. In the second embodiment, components same as those in the first embodiment will be given the same reference numerals, to avoid repetitive explanations.

(Structural Layer)

The structural layer 27 has a plurality of structures 27a and an intermediate layer (optical layer) 27b. The structural layer 27, the structures 27a and the intermediate layer 27b are constituted in the same way as the structural layer 22, the structures 22a, and the intermediate layer 22b in the first embodiment, except that the light absorber is contained.

The light absorber absorbs light in at least a predetermined wavelength region, among from lights incident on the structural layer 27. Now such predetermined wavelength region is a wavelength region of 550 nm or longer, 575 nm or longer, or 600 nm or longer. The upper limit value of the predetermined wavelength region is not specifically limited, but may fall on or below the lower limit value of the second wavelength region, and may typically be 690 nm or shorter, 700 nm or shorter, 710 nm or shorter, 720 nm or shorter, or 730 nm or shorter.

As the light absorber, employable for example is at least one of organic dye, nanoparticle of metal oxide, or organometallic complex. Organic dye is preferable from the viewpoint of solubility in the energy ray curable resin composition. The organic dye is preferably at least one of phthalocyanine-nickel complex or phthalocyanine-copper complex. Phthalocyanine-nickel complex is particularly preferable. The phthalocyanine-nickel complex and phthalocyanine-copper complex are soluble in the energy ray curable resin composition, show good absorption property to light in the aforementioned wavelength region, and have good heat resistance. Among from the phthalocyanine-nickel complex and phthalocyanine-copper complex, the phthalocyanine-nickel complex has a particularly high heat resistance.

(Multilayered Film)

Figure 5:
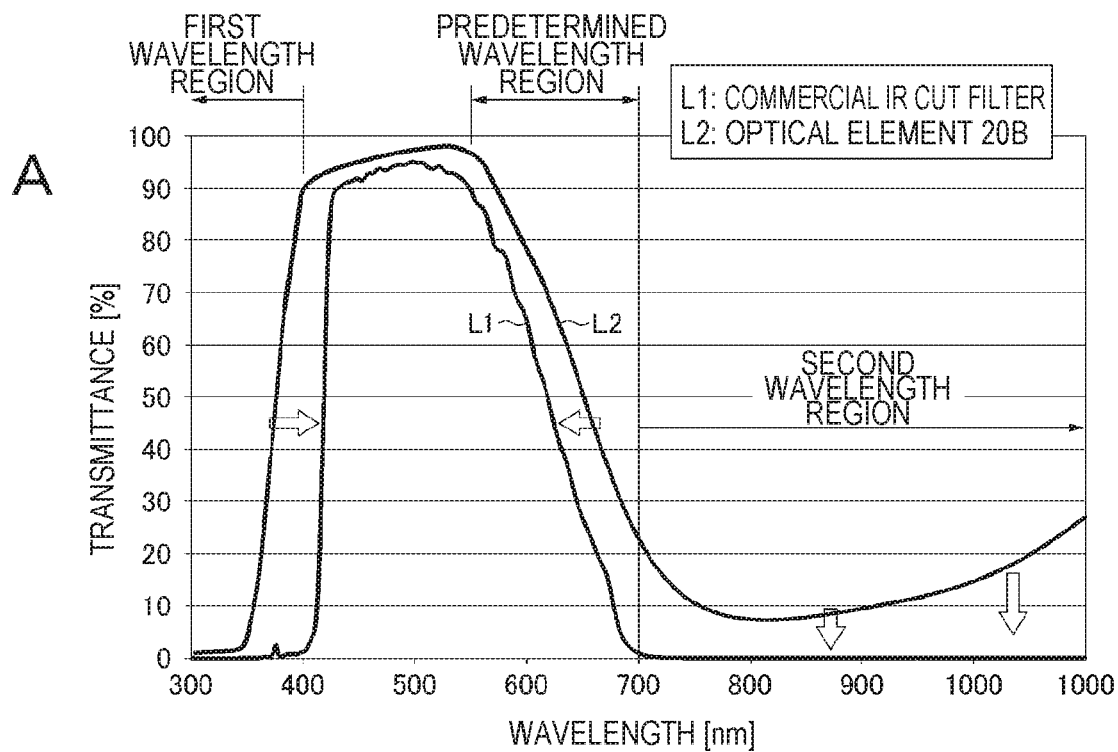
FIG. 5A is a graph explaining spectral characteristics of an IR cut filter and the optical element.
FIG. 5B is a cross-sectional view illustrating an exemplary structure of the optical element having the spectral characteristics illustrated in FIG. 5A.
Figure 5:
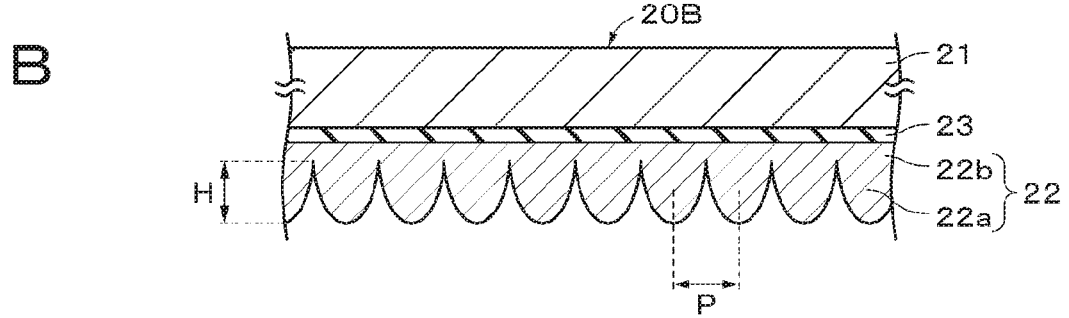

FIG. 5A illustrates exemplary spectral characteristics of a commercial IR cut filter and an optical element 20B. Note that the optical element 20B has a structure same as the optical element 20 according to the first embodiment (see FIG. 1B), except that the multilayered film 24 is not provided as illustrated in FIG. 5B. The optical element 20B shows larger transmittance of light in the first and second wavelength regions and in the aforementioned predetermined wavelength region, as compared with the commercial IR cut filter. In order to enhance the optical element 20B not only with a reflection suppressing function but also with functions equivalent or comparable to those of the commercialized IR cut filter, the optical element 20B is desired to have reduced transmittance of light in the first and second wavelength regions, and in the aforementioned predetermined wavelength region.

Now in this second embodiment, the structural layer 27 that contains a light absorber for absorbing light in the aforementioned predetermined wavelength region as described above is disposed on one face of the base 21, and the multilayered film 28 that functions to cut light in the first and second wavelength regions (specified wavelength region) (for example, light in the wavelength region other than the visible region) is disposed on the other face of the base 21. Note that the transmittance of light in the first and second wavelength regions is preferably 1% or smaller.

Now the first wavelength region is a region containing at least a wavelength region of ultraviolet radiation, and is more specifically 430 nm or shorter, 420 nm or shorter, 410 nm or shorter, 400 nm or shorter, or 390 nm or shorter. The lower limit of the first wavelength region is typically, but not limited to, 315 nm or longer, 280 nm or longer, or 200 nm or longer. The second wavelength region is a region containing at least the infrared wavelength region, and is more specifically 690 nm or longer, 700 nm or longer, 710 nm or longer, 720 nm or longer, or 730 nm or longer. The upper limit of the second wavelength region is specifically, but not limited to, 1100 nm or shorter, 1400 nm or shorter, or 1600 nm or shorter. If the light absorber contained in the structural layer 27 can absorb the light in the second wavelength region, the multilayered film 24 may have a function for cutting the light only in the first wavelength region, among from the lights in the first and second wavelength regions.

[Method for Manufacturing Optical Element]

A method for manufacturing the optical element 20A according to the first embodiment of this technology is same as the method for manufacturing the optical element 20 according to the first embodiment, except that the imprinting material is prepared by adding a light absorber to the energy ray curable resin composition, and that the multilayered film 24 is formed on the other face of the base 21.

[Effects]

The element package 10A according to the second embodiment has the structural layer 27 that is disposed on one face of the base 21 and contains the light absorber, and the multilayered film 28 that is disposed on the other face of the base 21 and has a function for cutting the lights in the first and second wavelength regions. Since the optical element 20A can be enhanced not only with the reflection suppressing function, but also with a function equivalent or comparable to those of the commercialized IR cut filter, so that the reflection type infrared cut filter 31 will be omissible from an optical system of the imaging device. Hence the reflection of the diffracted light Lb on the reflection type infrared cut filter 31 will no longer occur, so that it becomes possible to suppress the ghost orbs from appearing even when a strong light such as sunlight is shot by the element package 10A. In addition, since the optical element 20A covers functionality of the commercial IR cut filter, so that the optical system of the imaging device will be simplified.

Modified Example

Modified Example 1

Figure 6:
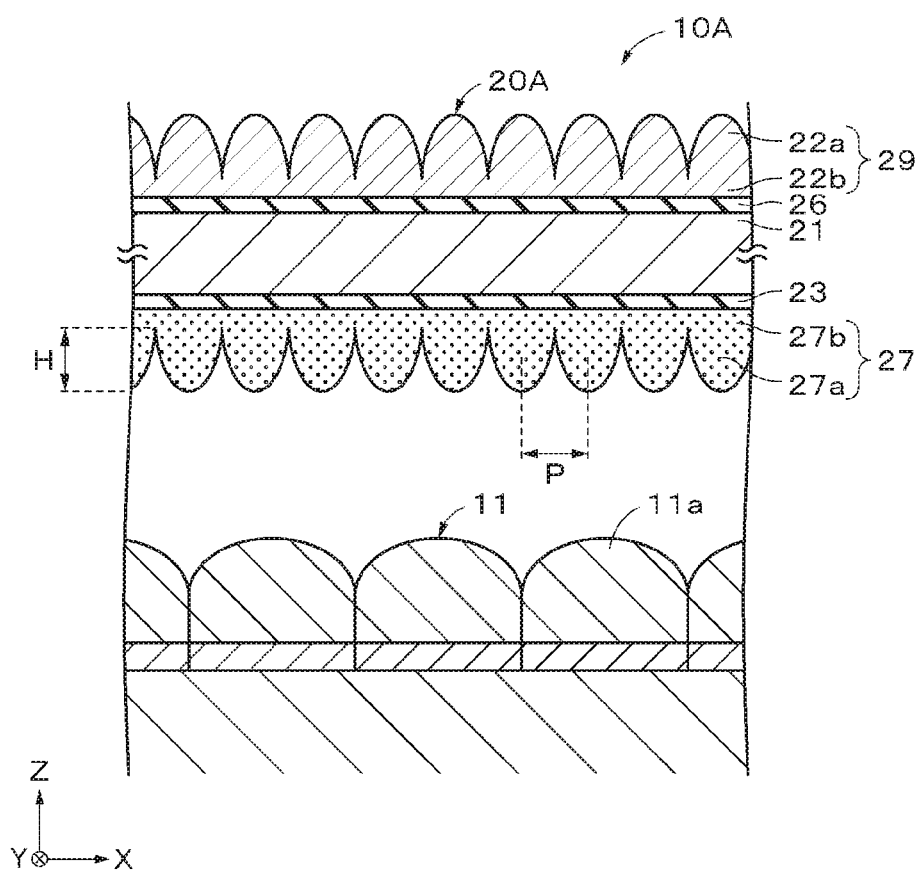
FIG. 6 is a cross-sectional view illustrating an exemplary structure of an image sensor package according to modified example 1 of the second embodiment of this technology.

The optical element 20A may have, as illustrated in FIG. 6, a structural layer 29 on the other face of the base 21, in place of the multilayered film 28. In this case, the silane coupling agent 26 may be disposed between the other face of the base 21 and the structural layer 29. The structural layer 29 may have a structure same as the structural layer 22 in the first embodiment, or may have a structure same as the structural layer 27 in the second embodiment. FIG. 6 illustrates an exemplary case where the structural layer 29 has the same structure as the structural layer 22 in the first embodiment. Note that the array pitch P, height H and aspect ratio (H/P) of the structure 27a of the structural layer 27, and the structure 22a of the structural layer 29, may be same or different.

Modified Example 2

Although the second embodiment has explained the element package 10A having the microlens 11a, the image sensor 11 does not always necessarily have the microlens 11a. Since the light La in the predetermined wavelength region may occasionally be diffracted or reflected on components other than the microlens 11a, so that this technology is effective when applied to the element package having no microlens 11a. Since, however, the image sensor 11 having the microlens 11a causes much diffracted light, and is more likely to cause the ghost orbs, so that this technology is preferably applied to the element package 10A having the microlens 11a.

(Others)

The optical element 20A may be supported by the frame 14, so that the structural layer 27 faces towards the outside of element package 10A. The structure 27a may have a concave shape. As the imprinting material, a thermosetting resin may be used. It is also acceptable that the multilayered film 28 does not have a function for cutting light in the first and second wavelength regions, but only has a function for suppressing reflection.

3. Third Embodiment

Figure 7:
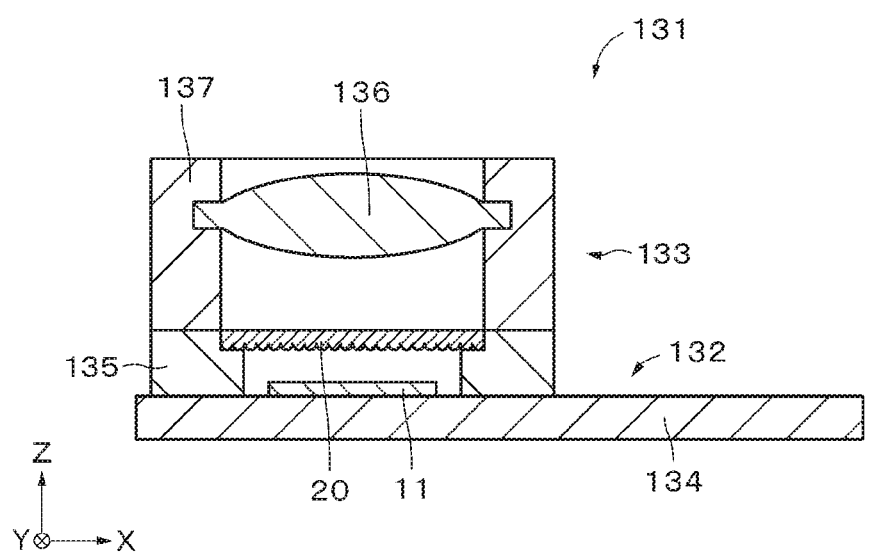
FIG. 7 is a cross-sectional view illustrating an exemplary structure of a camera module according to a third embodiment of this technology.

As illustrated in FIG. 7, a camera module (imaging module) 131 according to a third embodiment of this technology has an element package 132, and a lens unit 133. The element package 132 has the image sensor 11, and the element package 132 that houses the image sensor 11. Note that, in the third embodiment, components same as those in the first embodiment will be given the same reference numerals, to avoid repetitive explanations.

The element package 132 has a circuit board 134, a frame 135 disposed at a predetermined position on one main surface of the circuit board 134, and the optical element 20 supported at the circumference by the frame 135. The image sensor 11 is disposed on one face of the circuit board 134, meanwhile the optical element 20 is opposed to the imaging surface of the image sensor 11 while being supported by the frame 135 away from the imaging surface.

The lens unit 133 is fixed on the frame 135. The lens unit 133 has a lens 136, and an enclosure 137 as a lens holder that holds the circumference of the lens 136. The camera module 131 is suitable when applied to electronic devices such as personal computer, tablet computer, and mobile phone.

The camera module 131 according to the third embodiment may employ the optical element 20 according to the modified example of the first embodiment, or may employ the optical element 20A according to the second embodiment or the modified example of the same.

4 Fourth Embodiment

In a fourth embodiment, an exemplary case in which the aforementioned element package 10 according to the first embodiment is applied to the imaging device, will be explained.

Figure 8:
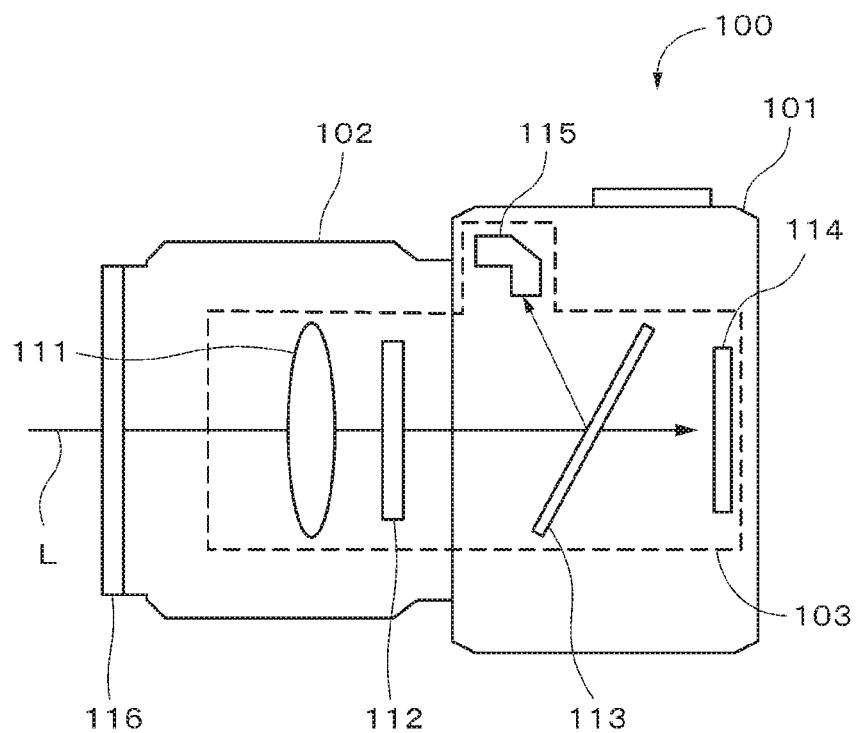
FIG. 8 is a schematic drawing illustrating an exemplary structure of an imaging device according to a fourth embodiment of this technology.

FIG. 8 is a schematic drawing illustrating an exemplary structure of an imaging device according to the fourth embodiment of this technology. As illustrated in FIG. 8, an imaging device 100 according to the fourth embodiment is a so-called digital camera (digital still camera), and has an enclosure 101, a lens barrel 102, and an imaging optical system 103 disposed in the enclosure 101 and the lens barrel 102. The enclosure 101 and the lens barrel 102 may be made detachable.

The imaging optical system 103 has a lens 111, a light intensity controller 112, a semitransmissive mirror 113, an element package 114, and an autofocus sensor 115. The lens 111, the light intensity controller 112, and the semitransmissive mirror 113 are arranged in this order from the front end of the lens barrel 102 towards the element package 114. The autofocus sensor 115 is disposed at a position where light L after reflected on the semitransmissive mirror 113 can be incident on. The imaging device 100 may optionally be provided with a filter 116. The individual components of the imaging device 100 will be explained in sequence below.

(Lens)

The lens 111 condenses light L from an object onto the element package 114. Note that a lens group may alternatively be disposed in place of the lens 111.

(Light Intensity Controller)

The light intensity controller 112 is a stop that controls size of an aperture stop centered round the optical axis of the imaging optical system 103. The light intensity controller 112 typically has a pair of aperture blades, and an ND filter that attenuates transmitted light. A drive system for the light intensity controller 112 may typically be, but not limited to, a system designed to drive the pair of aperture blades and the ND filter using a single actuator, or a system designed to individually drive the pair of aperture blades and the ND filter using two independent actuators. The ND filter employable here is a filter having a uniform transmittance or density, or a filter having a graduated transmittance or density. The number of ND filter is not limited to unity, instead allowing a plurality of ND filters to be used in a stacked manner.

(Semitransmissive Mirror)

The semitransmissive mirror 113 is a mirror that allows a part of incident light to pass therethrough, and reflects the residual part. More specifically, the semitransmissive mirror 113 reflects a part of light L after being condensed through the lens 111 towards the autofocus sensor 115, and allows the residual part of light L to transmit therethrough towards the element package 114.

(Element Package)

The element package 114 receives the light transmitted through the semitransmissive mirror 113, converts the light into an electric signal, and outputs the signal to a signal processing circuit (not illustrated). As the element package 114, employable is the element package 10 according to the first embodiment. Note that, the element package 10 according to the modified example of the first embodiment may be used as the element package 114, or the element package 10A according to the second embodiment or the modified example of the same may be used.

(Autofocus Sensor)

The autofocus sensor 115 receives light reflected on the semitransmissive mirror 113, converts the light into an electric signal, and outputs the signal to a control circuit (not illustrated).

(Filter)

The filter 116 is disposed at the front end of the lens barrel 102, or within the imaging optical system 103. Note that FIG. 8 illustrates an exemplary case where the filter 116 is disposed at the front end of the lens barrel 102. When this structure is employed, the filter 116 may be made detachable to the front end of the lens barrel 102.

The filter 116 may be any of those typically disposed at the front end of the lens barrel 102 or within the imaging optical system 103, and is not specifically limited. Examples include polarizing (PL) filter, sharp cut (SC) filter, color enhancement and special effects filter, neutral density (ND) filter, light balancing (LB) filter, color control (CC) filter, white balance acquisition filter, and lens protection filter.

5 Fifth Embodiment

Although the fifth embodiment above described an exemplary case where this technology is applied to a digital camera (digital still camera) as the imaging device, applications of this technology is not limited thereto. In a fifth embodiment, an exemplary case where this technology is applied to a digital video camera will be explained.

Figure 9:
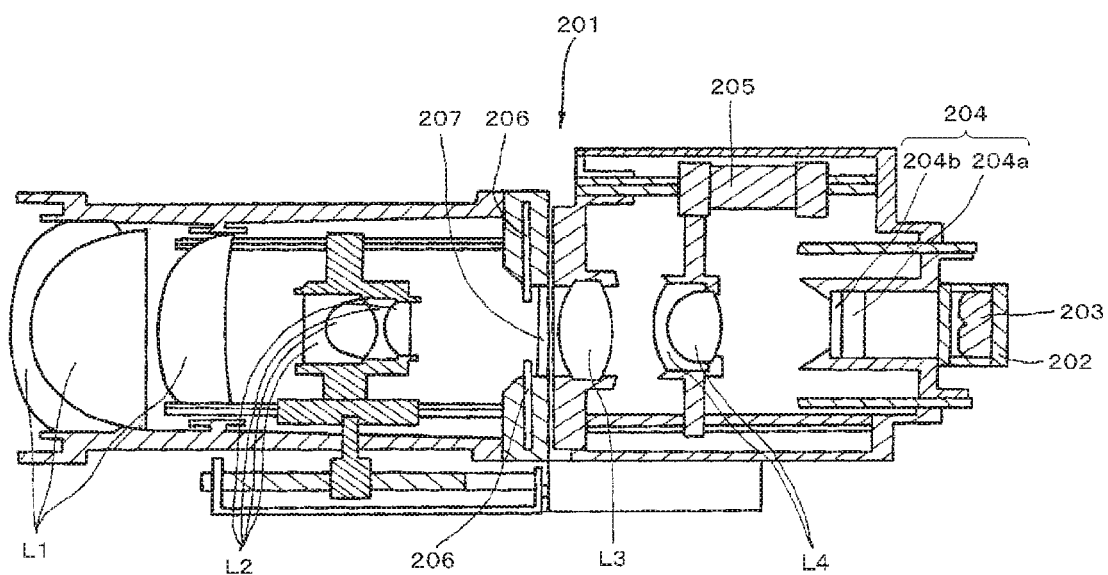
FIG. 9 is a schematic drawing illustrating an exemplary structure of an imaging device according to a fifth embodiment of this technology.

FIG. 9 illustrates a schematic drawing illustrating an exemplary structure of an imaging device according to the fifth embodiment of this technology. As illustrated in FIG. 9, an imaging device 201 according to the fifth embodiment is a so-called digital video camera, and has a first lens group L1, a second lens group L2, a third lens group L3, a fourth lens group L4, an element package 202, a low pass filter 203, a filter 204, a motor 205, an iris blade 206, and an electrical light control element 207. In the imaging device 201, an imaging optical system is composed using the first lens group L1, the second lens group L2, the third lens group L3, the fourth lens group L4, the element package 202, the low pass filter 203, the filter 204, the iris blade 206, and the electrical light control element 207. An optical control device is composed using the iris blade 206 and the electrical light control element 207. The individual components of the imaging device 201 will be explained in sequence below.

(Lens Groups)

The first lens group L1 and the third lens group L3 are fixed lenses. The second lens group L2 is a zooming lens. The fourth lens group L4 is a focus lens.

(Element Package)

The element package 202 converts incident light into an electric signal, and sends the signal to an unillustrated signal processing section. As the element package 202, employable is the element package 10 according to the first embodiment. Note that the element package 10 according to the modified example of the first embodiment may be used as the element package 202, or the element package 10A according to the second embodiment or the modified example of the same may be used. Also note that in a case where the element package 10A according to the second embodiment or the modified example of the same is used, the filter 204 is omissible.

(Low Pass Filter)

The low pass filter 203 is disposed typically on the front of the element package 202, that is, the light incident surface of a cover glass. The low pass filter 203 is used to suppress alias (moire) which can be produced when an object having a stripe pattern as fine as pixel pitch is shot, and is typically made of artificial quartz.

The filter 204 typically cuts infrared region of light that is incident on the element package 202, and suppresses elevation of spectral baseline in the near infrared region (630 nm to 700 nm), to thereby equalize light intensity over the visible region (400 nm to 700 nm). The filter 204 is typically composed using an infrared cut filter (referred to as IR cut filter, hereinafter) 204a, and an IR cut coating layer 204b formed by laminating an IR cut coat on the IR cut filter 204a. Now the IR cut coating layer 204b is typically formed at least either on the face of the IR cut filter 204a faced to the object, or on the face of the IR cut filter 204a faced to the element package 202. FIG. 9 illustrates an exemplary case where the IR cut coating layer 204b is formed on the face of the IR cut filter 204a faced to the object.

The motor 205 drives the fourth lens group L4 in response to a signal sent from an unillustrated control section. The iris blade 206 is a component that controls intensity of light incident on the element package 202, and is driven by an unillustrated motor.

The electrical light control element 207 is a component that controls intensity of light incident on the element package 202. The electrical light control element 207 is an electrical light control element that includes a liquid crystal containing at least a dye-based coloring matter, and is typically an electrical light control element that includes a dichroic GH liquid crystal.

6 Sixth Embodiment

An electronic device according to a sixth embodiment has the camera module 131 according to the third embodiment. An exemplary electronic device according to the sixth embodiment of this technology will be explained below.

Figure 10:
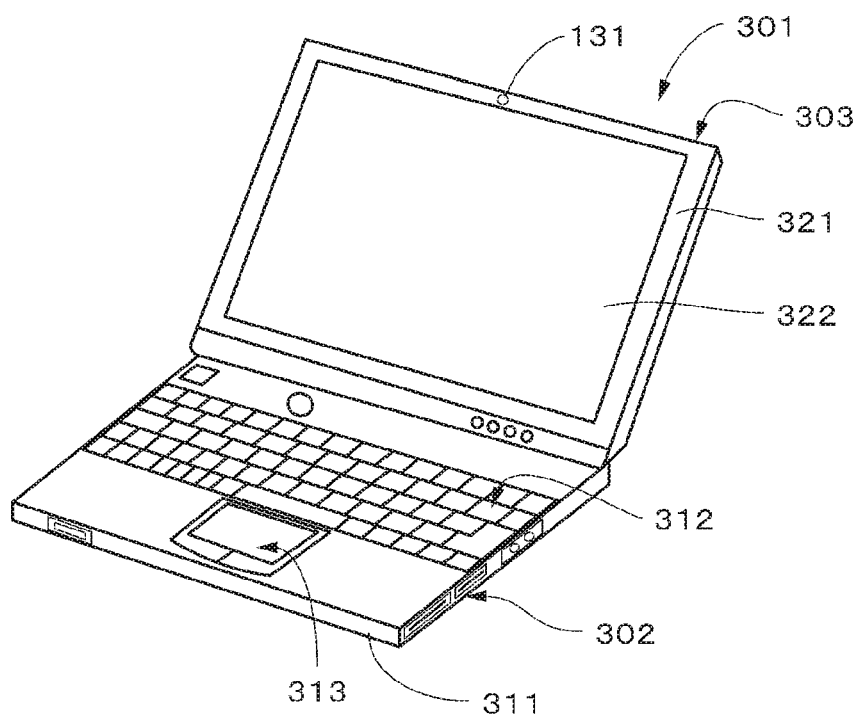
FIG. 10 is a perspective view illustrating an exemplary appearance of a first electronic device according to a sixth embodiment of this technology.

Referring to FIG. 10, an exemplary case where the electronic device is a laptop personal computer 301 will be explained. The laptop personal computer 301 has a computer body 302, and a display 303. The computer body 302 has an enclosure 311, and, a keyboard 312 and a touch pad 313 which are housed in the enclosure 311. The display 303 has an enclosure 321, and, a display element 322 and a camera module 131 which are housed in the enclosure 321.

Figure 11:
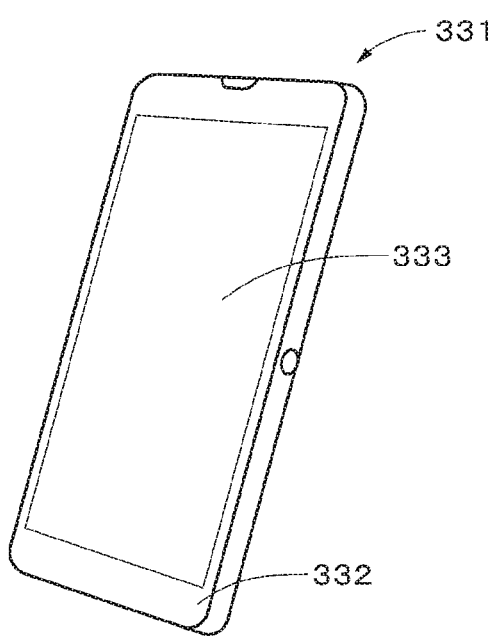
FIG. 11A is a perspective view illustrating an exemplary front appearance of a second electronic device according to a sixth embodiment of this technology.
FIG. 11B is a perspective view illustrating an exemplary rear appearance of the second electronic device according to the sixth embodiment of this technology.
Figure 11:
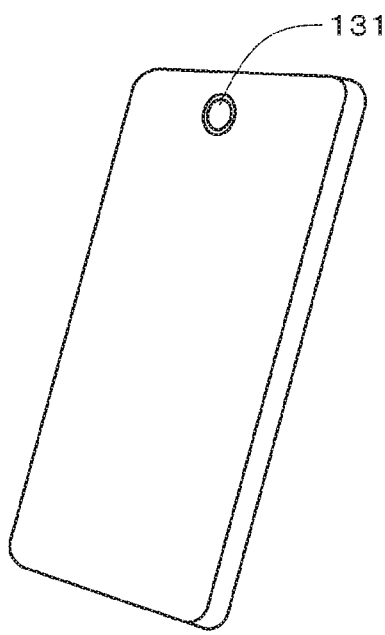

Referring to FIG. 11A and FIG. 11B, an exemplary case where the electronic device is a mobile phone 331 will be explained. The mobile phone 331 is a so-called smartphone, and has an enclosure 332, and, a display element with touch panel 333 and a camera module 131 which are housed in the enclosure 332. The display element with touch panel 333 is disposed on the front face side of the mobile phone 331, meanwhile the camera module 131 is disposed on the rear face side of the mobile phone 331.

Figure 12:
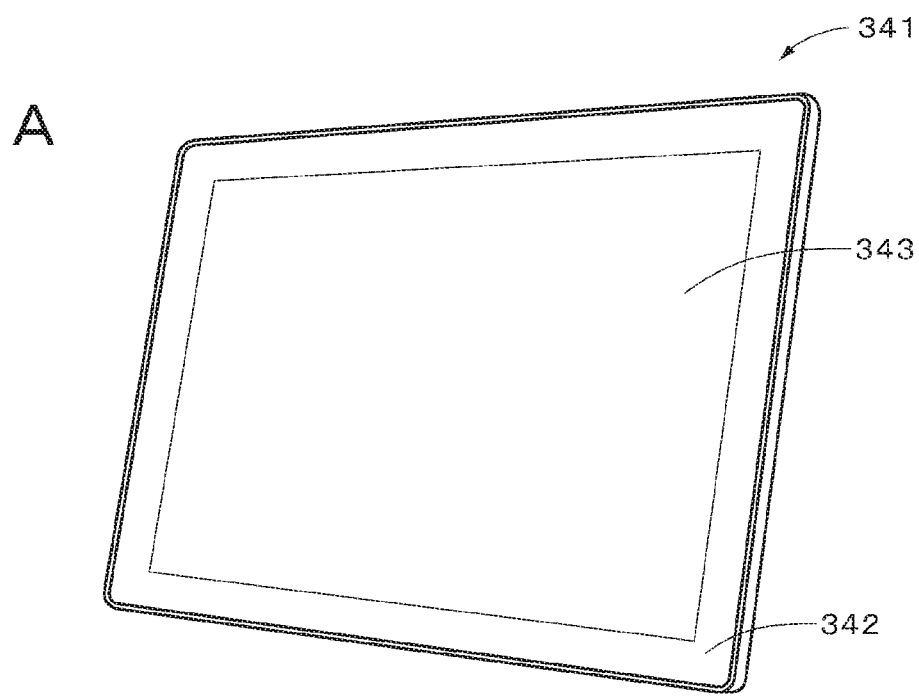
FIG. 12A is a perspective view illustrating an exemplary front appearance of a third electronic device according to the sixth embodiment of this technology.
FIG. 12B is a perspective view illustrating an exemplary rear appearance of the third electronic device according to the sixth embodiment of this technology.
Figure 12:
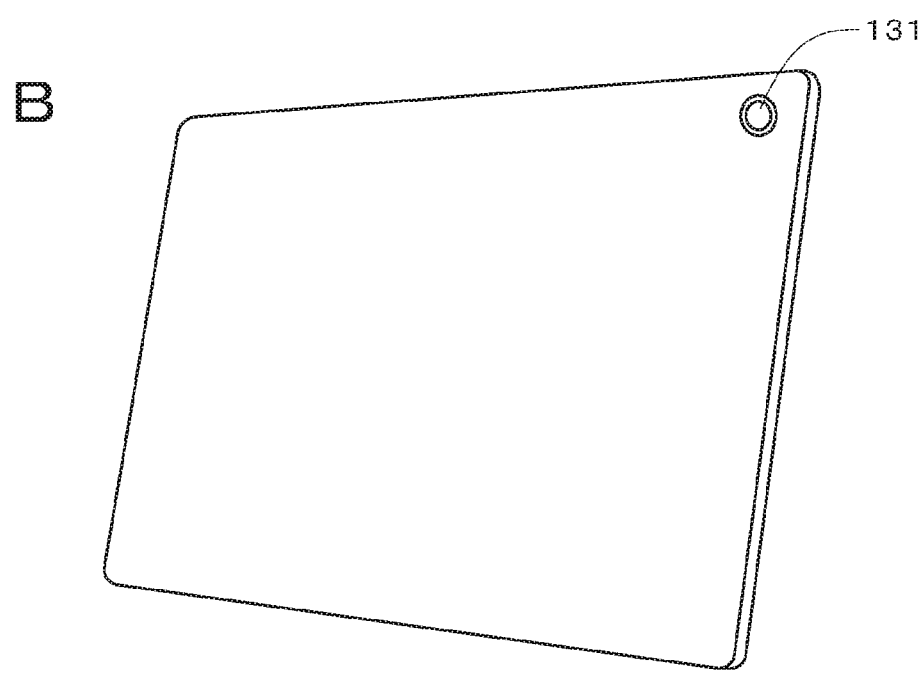

Referring to FIG. 12A and FIG. 12B, an exemplary case where the electronic device is a tablet computer 341 will be explained. The tablet computer 341 has an enclosure 342, and, a display element with touch panel 343 and a camera module 131 which are housed in the enclosure 342. The display element with touch panel 343 is disposed on the front face side of the tablet computer 341, meanwhile the camera module 131 is disposed on the rear face side of the tablet computer 341.

EXAMPLES

The present technology will be explained specifically referring to Examples, without limiting the present technology to these Examples.

In this embodiment, the height H, array pitch P and aspect ratio (H/P) of the moth-eye structure are same as the values determined in the first embodiment.

Example 1

First, a glass substrate used for a cover glass of the element package was obtained, and one face of the glass substrate was treated with a silane coupling agent. Next, a solventless-type UV curable resin composition, containing a polyfunctional vinyl resin and an acrylate was coated on such one face of the glass substrate. Next, the mold face of the moth-eye master plate was pressed against the UV curable resin composition, and UV light was irradiated to cure to the UV curable resin composition.

The thus cured UV curable resin composition was separated together with the glass substrate, from the moth-eye master plate. In this way, the glass substrate having on its main surface the moth-eye structural layer was obtained. The moth-eye structure composing the moth-eye structural layer was designed to have a height H of 270 nm, an array pitch P of 250 nm, and an aspect ratio H/P of 1.08. A target glass substrate with moth-eye structural layer (referred to as "moth-eye glass substrate", hereinafter) was thus obtained.

Example 2

First, 0.2 parts by mass of phthalocyanine-nickel complex as a light absorber (organic dye) was added to 100 parts by mass of a solventless-type UV curable resin composition that contains a polyfunctional vinyl resin and an acrylate, and then dissolved. Then a moth-eye glass substrate was obtained in the same way as in Example 1, except that this composition was used.

Comparative Example 1

A moth-eye glass substrate was obtained in the same way as in Example 1, except that a solventless-type UV curable resin composition containing acrylic esters was used.

Comparative Example 2

A moth-eye glass substrate was obtained in the same way as in Example 1, except that a solventless-type UV curable resin composition containing an acrylic resin was used.

Comparative Example 3

A moth-eye glass substrate was obtained in the same way as in Example 1, except that a solventless-type UV curable resin composition containing acrylic esters and hexamethylene diacrylate was used.

Comparative Example 4

First, 0.1 parts by mass of phthalocyanine-vanadium complex as a light absorber (organic dye) was added to 100 parts by mass of a solventless-type UV curable resin composition that contains a polyfunctional vinyl resin and an acrylate, and then dissolved. Next, a moth-eye glass substrate was obtained in the same way as in Example 1, except that this composition was used.

(Evaluation)

The moth-eye glass substrates thus obtained in Examples 1, 2, and Comparative Examples 1 to 4 were evaluated as below. Note that Comparative Example 4 was not evaluated in a high-temperature, high-humidity environmental test (2) and so forth, since a good result could not be obtained in a high-temperature, high-humidity environmental test (1). Also note that Example 2 and Comparative Example 4 were not evaluated regarding the variation of transmittance between before and after high-temperature, high-humidity environmental test, and the variation of transmittance between before and after low-temperature environmental test.

(Adhesiveness)

First, the moth-eye structural layer was subjected to the cross-cut test in compliance with JIS K5600-5-6. Next, appearance of a grid after the test was evaluated according to classifications 1 to 5 specified in JIS K5600-5-6, and on the basis of the result of evaluation, the adhesiveness was determined in accordance with the criteria below:

○: fallen under classifications 0 to 2 specified in JIS K5600-5-6;

x: fallen under classifications 3 to 5 specified in JIS K5600-5-6.

Note that the moth-eye structural layer, fallen under classifications 3 to 5, may be likely to separate easily. If the structural layer 22 partially separates, such partial area will lose brightness, so that the obtainable images may degrade.

(Evaluation of Initial Transmission Characteristic (1))

Initial transmittance [%] of the cover glass was evaluated as described below. The face on which the moth-eye structural layer was formed was irradiated with light, to measure a transmission spectrum of the moth-eye glass substrate, using an evaluation apparatus (V-550) from JASCO Corporation. Note that incident angle of the light irradiated on the face of the moth-eye structural layer was set to 90°. Next, from the thus measured transmission spectrum, a minimum initial transmittance [%] in the wavelength region from 470 nm to 550 nm was determined. Next, the thus determined minimum initial transmittance [%] was evaluated in accordance with the criteria below:

○: minimum transmittance ≥90%;

x: minimum transmittance <90%.

Note that, in a case where the moth-eye glass substrate with the transmittance fallen below 90% is used for the element package, images obtainable by the element package may become dark, and may degrade.

(Evaluation of Initial Transmission Characteristic (2))

First, from the transmission spectrum obtained in the same way as in "Evaluation of Initial Transmission Characteristic (1)", the minimum initial transmittance [%] in the wavelength region from 420 nm to 600 nm was determined. Next, the thus determined minimum initial transmittance [%] was evaluated in accordance with the criteria same as those in "Evaluation of Initial Transmission Characteristic (1)".

(Evaluation of Variation of Transmittance between before and after Reflow Test)

First, transmission spectrum of the moth-eye glass substrate was acquired in the same way as described in the aforementioned "Evaluation of Initial Transmission Characteristic". Next, the moth-eye glass substrate was subjected to the reflow test (testing by keeping the moth-eye glass substrate in an environment at 245° C. for 5 min), and the transmission spectrum of the moth-eye glass substrate was acquired again, in the same way as in the aforementioned "Evaluation of Initial Transmission Characteristic". Next, from the transmission spectra acquired before and after the reflow test, a maximum variation of transmittance ΔTmax [%](=(transmittance after reflow test [%])−(transmittance before reflow test [%])) in the wavelength region from 420 nm to 600 nm was determined, and the variation of transmittance was evaluated using the maximum variation ΔTmax, in accordance with the criteria below. Note that the difference of transmittance [%] between before and after the reflow test in the equation above means a difference [%] of transmittance between before and after the reflow test measured at the same wavelength.

○: Maximum variation of transmittance ΔTmax≤±1%;
x: maximum variation of transmittance ΔTmax>±1%.

Note that, with the maximum variation of transmittance ΔTmax exceeding ±1% between before and after the reflow test, the moth-eye glass substrate when used for the element package may cause modified color reproducibility of the element package, typically due to denaturation of the moth-eye structural layer in the reflow process for mounting the element package on a circuit board or the like, so that images obtainable by the element package may degrade.

(Evaluation of Variation of Transmittance Between Before and after High-Temperature Environmental Test (1))

First, maximum variation of transmittance ΔTmax in the wavelength region from 420 nm to 600 nm was determined in the same way as in the aforementioned "Evaluation of Variation of Transmittance between before and after Reflow Test", except that the high-temperature environmental test (1) (testing by keeping the moth-eye glass substrate in an environment at 150° C. for 250 h) was conducted in place of the reflow test. Next, using the thus determined maximum variation ΔTmax, the variation of transmittance was determined in accordance with the criteria below:

○: maximum variation of transmittance ΔTmax≤±1%;
x: maximum variation of transmittance ΔTmax>±1%.

Note that, with the maximum variation of transmittance ΔTmax exceeding ±1% between before and after the high-temperature environmental test, the moth-eye glass substrate when used for the element package may cause a failure below. That is, the element package when stored in the high temperature environment may have modified color reproducibility due to denaturation of the moth-eye structural layer or the like, so that images obtainable by the element package may degrade.

(Evaluation of Variation of Transmittance Between Before and after High-Temperature Environmental Test (2))

First, maximum variation of transmittance ΔTmax in the wavelength region from 420 nm to 600 nm was determined in the same way as in the aforementioned "Evaluation of Variation of Transmittance between before and after High-Temperature Environmental Test (1)", except that the high-temperature environmental test (2) (testing by keeping the moth-eye glass substrate in an environment at 150° C. for 1000 h) was conducted. Next, the variation of transmittance was determined in accordance with the criteria same as those in "Evaluation of Variation of Transmittance between before and after High-Temperature Environmental Test (1)".

(Evaluation of Variation of Transmittance Between Before and after High-Temperature, High-Humidity Environmental Test)

First, maximum variation of transmittance ΔTmax in the wavelength region from 420 nm to 600 nm was determined in the same way as in the aforementioned "Evaluation of Variation of Transmittance between before and after Reflow Test", except that the high-temperature, high-humidity environmental test (testing by keeping the moth-eye glass substrate in an environment at 80° C., 85% humidity for 1000 h) was conducted in place of the reflow test. Next, using the thus determined maximum variation ΔTmax, determination was made in accordance with the criteria below:

○: maximum variation of transmittance ΔTmax≤±1%;
x: maximum variation of transmittance ΔTmax>±1%.

Note that, with the maximum variation of transmittance ΔTmax exceeding ±1% between before and after the high-temperature, high-humidity environmental test, the moth-eye glass substrate when used for the element package may cause a failure below. That is, the element package when stored in the high-temperature, high-humidity environment may have modified color reproducibility due to denaturation of the moth-eye structural layer, so that images obtainable by the element package may degrade.

(Evaluation of Variation of Transmittance Between Before and after Low-Temperature Environmental Test)

First, maximum variation of transmittance ΔTmax in the wavelength region from 420 nm to 600 nm was determined in the same way as in the aforementioned "Evaluation of Variation of Transmittance between before and after Reflow Test", except that the low-temperature environmental test (testing by keeping the moth-eye glass substrate in an environment at −40° C. for 1000 h) was conducted in place of the reflow test. Next, using the thus determined maximum variation ΔTmax, the variation of transmittance was determined in accordance with the criteria below:

○: maximum variation of transmittance ΔTmax≤±1%;
x: maximum variation of transmittance ΔTmax>±1%.

Note that, with the maximum variation of transmittance ΔTmax exceeding ±1% between before and after the low-temperature environmental test, the moth-eye glass substrate when used for the element package may cause a failure below. That is, the element package when stored in the low-temperature environment may have modified color reproducibility typically due to denaturation of the moth-eye structural layer, so that images obtainable by the element package may degrade.

(Reflectance)

Reflectance [%] of the moth-eye glass substrate was evaluated as described below. First, a black tape was placed on the back face of the moth-eye glass substrate (the face opposite to the moth-eye structural layer). Next, the face on which the moth-eye structural face was formed was irradiated with light, to measure a reflection spectrum of the moth-eye glass substrate, using an evaluation apparatus (V-550) from JASCO Corporation. Note that incident angle of the light irradiated on the face of the moth-eye structural layer was set to 90°. Next, from the thus measured reflection spectrum, a maximum reflectance [%] in the wavelength region from 400 nm to 700 nm was determined. Next, the thus determined maximum reflectance [%] was evaluated in accordance with the criteria below:

◯: maximum reflectance ≤1%;
x: maximum reflectance >1%.

Note that, in a case where the moth-eye glass substrate with the reflectance exceeding 1% is used for the element package, images obtainable by the element package may become dark, and the images may degrade.

Table 1 and Table 2 summarize results of evaluation of the moth-eye glass substrates in Examples 1 and 2, and Comparative examples 1 to 4.

Example 2, in which phthalocyanine-nickel complex was added to the aforementioned UV curable resin composition, failed to show good result in initial transmission characteristic (2), but showed good results in other evaluation items such as evaluation of variation of transmittance between before and after high-temperature environmental test (1) and so forth. Meanwhile, the Comparative Example 4 in which phthalocyanine-vanadium complex was added to the aforementioned UV curable resin composition, failed to show good result in evaluation of variation of transmittance between before and after high-temperature environmental test (1).

The embodiments and examples of the present technology have been specifically described above. However, the present technology is not limited to the above-described embodiments and examples. Various modifications of the present technology can be made without departing from the technical spirit of the present technology.

For example, the configurations, the methods, the processes, the shapes, the materials, the numerical values, and the like mentioned in the above-described embodiments and examples are merely examples. Different configurations, methods, processes, shapes, materials, numerical values, and the like may be used, as necessary.

Further, configuration, methods, processes, shapes, materials, numerical values and the like in the above-described

TABLE 1

| | UV curable resin composition | | Adhesiveness to glass | Initial transmission characteristic (1) (470-550 nm) | Initial transmission characteristic (2) (420-600 nm) |
|---|---|---|---|---|---|
| | Resin material | Light absorber | | | |
| Example 1 | Polyfunctional vinyl resin acrylate | — | ◯ | ◯ | ◯ (94.7%) |
| Example 2 | Polyfunctional vinyl resin acrylate | Phthalocyanine-nickel complex | ◯ | ◯ | x (61.9%) |
| Comparative Example 1 | Acrylic esters | — | ◯ | ◯ | ◯ (94.6%) |
| Comparative Example 2 | Acrylic resins | — | ◯ | ◯ | ◯ (94.6%) |
| Comparative Example 3 | Acrylic esters, hexamethylene diacrylate | — | ◯ | ◯ | ◯ (94.0%) |
| Comparative Example 4 | Polyfunctional vinyl resin acrylate | Phthalocyanine-vanadium complex | ◯ | — | — |

TABLE 2

| | Variation of transmittance | | | | | |
|---|---|---|---|---|---|---|
| | Reflow test, between before and after (245° C., 5 min) | High-temperature environmental test (1), between before and after (150° C., 250 h) | High-temperature environmental test (2), between before and after (150° C., 1000 h) | High-temperature, high-humidity environmental test, between before and after (80° C., 85%, 1000 h) | Low-temperature environmental test, between before and after (−40° C., 1000 h) | Initial reflection characteristic (400-700 nm) |
| Example 1 | ◯ (−0.31%) | ◯ (−0.57%) | ◯ (−0.96%) | ◯ (−0.31%) | ◯ (−0.73%) | ◯ |
| Example 2 | ◯ (−0.77%) | ◯ (0.43%) | X (−1.6%) | — | — | ◯ |
| Comparative Example 1 | ◯ (−0.45%) | X (−2.67%) | X (−13.1%) | ◯ (−0.59%) | ◯ (−0.43%) | ◯ |
| Comparative Example 2 | X (−2.73%) | X (−2.72%) | X (−4.76%) | X (−2.73%) | ◯ (−0.48%) | ◯ |
| Comparative Example 3 | ◯ (−0.4%) | ◯ (−0.52%) | X (−8.13%) | ◯ (0.1%) | ◯ (−0.14%) | ◯ |
| Comparative Example 4 | ◯ (−0.46%) | X (69.5%) | — | — | — | ◯ |

Note that in Table 1, numerals in parentheses in the column titled "Initial transmission characteristic" represent initial transmittance [%]. Meanwhile in Table 2, numerals in parentheses in the columns titled "Variation of transmittance" represent maximum variation ΔTmax.

Table 1 and Table 2 teach as follows. Example 1, using a solventless-type UV curable resin composition that contains polyfunctional vinyl resin and acrylate, showed good results in all evaluation items. Meanwhile, Comparative Examples 1 to 3, without using the aforementioned UV curable resin composition, did not show good result at least in one of the evaluation items.

embodiments and examples may be combined insofar as they are not departing from the spirit of the present technology.

Additionally, the present technology may also be configured as below.

(1)

An optical element including:

a base; and an uneven structure layer that is disposed on one face of the base, and suppresses reflectance, the optical element having a reflectance of 1% or smaller, in a wavelength region of 400 nm or longer and 700 nm or shorter, a transmittance of 90% or larger, in a wavelength region of 470 nm or longer and 550 nm or shorter, and a variation of transmittance of 1% or smaller, between before and after a high-temperature environmental test conducted at 150° C. for 250 h.

(2)

The optical element according to (1), having a variation of transmittance of 1% or smaller, between before and after a high-temperature environmental test conducted at 150° C. for 1000 h.

(3)

The optical element according to (1) or (2), having a variation of transmittance of 1% or smaller, between before and after a heat resistance test conducted at 245° C. for 5 min.

(4)

The optical element according to any one of (1) to (3), having a transmittance of 90% or larger, in a wavelength region of 420 nm or longer and 600 nm or shorter.

(5)

The optical element according to any one of (1) to (4), in which the uneven structure layer contains an organic resin, and the base contains at least one of glass, crystallized glass, or crystal.

(6)

The optical element according to (5), in which the organic resin is a cured article of a UV curable resin composition.

(7)

The optical element according to (6), in which the UV curable resin composition is at least one of a first composition that contains a first compound having vinyl group and a second compound having (meth)acryloyl group; or a second composition that contains a third compound having vinyl group and (meth)acryloyl group.

(8)

The optical element according to (6) or (7), in which the UV curable resin composition is of solventless type.

(9)

The optical element according to any one of (1) to (8), in which the uneven structure layer contains a plurality of structures, and each structure has an aspect ratio of 1 or larger.

(10)

The optical element according to any one of (1) to (9), further including a multilayered film that is disposed on the other face of the base, and suppresses reflectance.

(11)

The optical element according to any one of (1) to (9), further including a multilayered film that is disposed on the other face of the base, and has a function for cutting light in a specified wavelength region.

(12)

The optical element according to any one of (1) to (9), further including an uneven structure layer that is disposed on the other face of the base, and suppresses reflectance.

(13)

The optical element according to any one of (1) to (12), in which the uneven structure layer contains a light absorber.

(14)

The optical element according to (13), in which the light absorber contains phthalocyanine-nickel complex.

(15)

The optical element according to any one of (1) to (14), having a silane coupling agent applied between the base and the uneven structure layer.

(16)

The optical element according to any one of (1) to (15), in which adhesiveness between the base and the uneven structure layer is denoted by any one of classifications 0 to 2, in a cross-cut test in compliance with JIS K5600-5-6.

(17)

The optical element according to any one of (1) to (16), being intended for an image sensor package.

(18)

An image sensor package including:

a package including the optical element according to any one of (1) to (17); and an image sensor housed in the package.

(19)

The image sensor package according to (18), in which the uneven structure layer is opposed to the image sensor.

(20)

The image sensor package according to (18) or (19), further including a multilayered film that is disposed on the other face of the base, and has a function for cutting light in a specified wavelength region, in which the uneven structure layer contains a light absorber.

(21)

The image sensor package according to any one of (18) to (19), in which the image sensor has, on a surface, a microlens.

(22)

An imaging device including the image sensor package according to any one of (18) to (21).

(23)

An electronic device including the image sensor package according to any one of (18) to (21).

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST 10, 10A image sensor package
11 image sensor
12 package
13 substrate
14 frame
20, 20A, 20B optical element 21 base
22, 25, 27 uneven structure layer
22a, 27a structure
22b, 27b intermediate layer
23, 26 silane coupling agent
24, 28 multilayered film

The invention claimed is:

1. An optical element comprising:
a base; and
an uneven structure layer that is disposed on one face of the base, and suppresses reflectance,
the optical element having
a reflectance of 1% or smaller, in a wavelength region of 400 nm or longer and 700 nm or shorter,
a transmittance of 90% or larger, in a wavelength region of 470 nm or longer and 550 nm or shorter, and
a variation of transmittance of 1% or smaller, between before and after a high-temperature environmental test conducted at 150° C. for 250 h.

2. The optical element according to claim 1, having a variation of transmittance of 1% or smaller, between before and after a high-temperature environmental test conducted at 150° C. for 1000 h.

3. The optical element according to claim 1, having a variation of transmittance of 1% or smaller, between before and after a heat resistance test conducted at 245° C. for 5 min.

4. An optical element comprising:
a base; and
an uneven structure layer that is disposed on one face of the base, and suppresses reflectance,
the optical element having
a reflectance of 1% or smaller, in a wavelength region of 400 nm or longer and 700 nm or shorter,
a transmittance of 90% or larger, in a wavelength region of 420 nm or longer and 600 nm or shorter, and
a variation of transmittance of 1% or smaller, between before and after a high-temperature environmental test conducted at 150° C. for 250 h.

5. The optical element according to claim 1,
wherein the uneven structure layer contains an organic resin, and
the base contains at least one of glass, crystallized glass, or crystal.

6. The optical element according to claim 5,
wherein the organic resin is a cured article of a UV curable resin composition.

7. The optical element according to claim 6,
wherein the UV curable resin composition is at least one of a first composition that contains a first compound having vinyl group and a second compound having (meth)acryloyl group; or a second composition that contains a third compound having vinyl group and (meth)acryloyl group.

8. The optical element according to claim 6,
wherein the UV curable resin composition is of solventless type.

9. The optical element according to claim 1,
wherein the uneven structure layer contains a plurality of structures, and
each structure has an aspect ratio of 1 or larger.

10. The optical element according to claim 1, further comprising a multilayered film that is disposed on the other face of the base, and suppresses reflectance.

11. The optical element according to claim 1, further comprising a multilayered film that is disposed on the other face of the base, and has a function for cutting light in a specified wavelength region.

12. The optical element according to claim 1, further comprising an uneven structure layer that is disposed on the other face of the base, and suppresses reflectance.

13. The optical element according to claim 1,
wherein the uneven structure layer contains a light absorber.

14. The optical element according to claim 13,
wherein the light absorber contains phthalocyanine-nickel complex.

15. The optical element according to claim 1, having a silane coupling agent applied between the base and the uneven structure layer.

16. The optical element according to claim 1,
wherein adhesiveness between the base and the uneven structure layer is denoted by any one of classifications 0 to 2, in a cross-cut test in compliance with JIS K5600-5-6.

17. The optical element according to claim 1, being intended for an image sensor package.

18. An image sensor package comprising:
a package including the optical element according to claim 1; and
an image sensor housed in the package.

19. The image sensor package according to claim 18,
wherein the uneven structure layer is opposed to the image sensor.

20. The image sensor package according to claim 18, further comprising a multilayered film that is disposed on the other face of the base, and has a function for cutting light in a specified wavelength region,
wherein the uneven structure layer contains a light absorber.

21. The image sensor package according to claim 20,
wherein the image sensor has, on a surface, a microlens.

22. An imaging device comprising the image sensor package according to claim 18.

23. An electronic device comprising the image sensor package according to claim 18.

24. An image sensor package comprising:
a package including the optical element according to claim 4; and
an image sensor housed in the package.

25. The image sensor package according to claim 24,
wherein the uneven structure layer is opposed to the image sensor.

26. The image sensor package according to claim 24, further comprising a multilayered film that is disposed on the other face of the base, and has a function for cutting light in a specified wavelength region,
wherein the uneven structure layer contains a light absorber.

27. The image sensor package according to claim 26,
wherein the image sensor has, on a surface, a microlens.

28. An imaging device comprising the image sensor package according to claim 24.

29. An electronic device comprising the image sensor package according to claim 24.

* * * * *